United States Patent [19]

Waldner

[11] Patent Number: 4,809,054
[45] Date of Patent: Feb. 28, 1989

[54] SEMICONDUCTOR LEAD FRAME

[76] Inventor: Kurt Waldner, 12260 Saraglen Dr., Saratoga, Calif. 95070

[21] Appl. No.: 889,655

[22] Filed: Jul. 25, 1986

[51] Int. Cl.[4] .......................................... H01L 23/48
[52] U.S. Cl. ...................................... 357/70; 29/827; 174/52.4
[58] Field of Search .................... 29/827; 174/52 FP; 357/70, 19; 428/571; 250/551

[56] References Cited

U.S. PATENT DOCUMENTS

| | | | |
|---|---|---|---|
| 3,893,158 | 7/1975 | Linda | 357/70 |
| 4,160,308 | 7/1979 | Courtney et al. | 357/70 X |
| 4,252,864 | 2/1981 | Coldren | 174/52 FP X |
| 4,322,628 | 3/1982 | Tanaka | 250/551 |
| 4,446,375 | 5/1984 | Aird | 357/70 X |
| 4,633,582 | 1/1987 | Ching et al. | 29/827 |

Primary Examiner—Timothy V. Eley
Attorney, Agent, or Firm—Townsend and Townsend

[57] ABSTRACT

A semiconductor lead frame suitable for making electronic components from semiconductor chips. The lead frame is of one-piece construction and is provided with a pair of spaced outer side strips and a plurality of spaced cross strips integral with and spanning the distance between the side strips. A plurality of pairs of pads are on the lead frame, there being a pair of spaced pads between each pair of adjacent cross strips. One of the pads of each pair is coupled to the outer ends of a pair of spaced, parallel legs which extend along the adjacent cross strips. The legs are bendable intermediate their ends sufficiently to cause the legs to become doubled upon themselves so that the pad coupled to the leg can be moved from an initial position generally spaced longitudinally from the corresponding other pad to a final position in overlying, spaced relationship to the other pad. A coating of solder applied to each pad, respectively, permits a semiconductor chip between the pads to be bonded to the pads when the lead frame is directed through a heating zone.

10 Claims, 3 Drawing Sheets

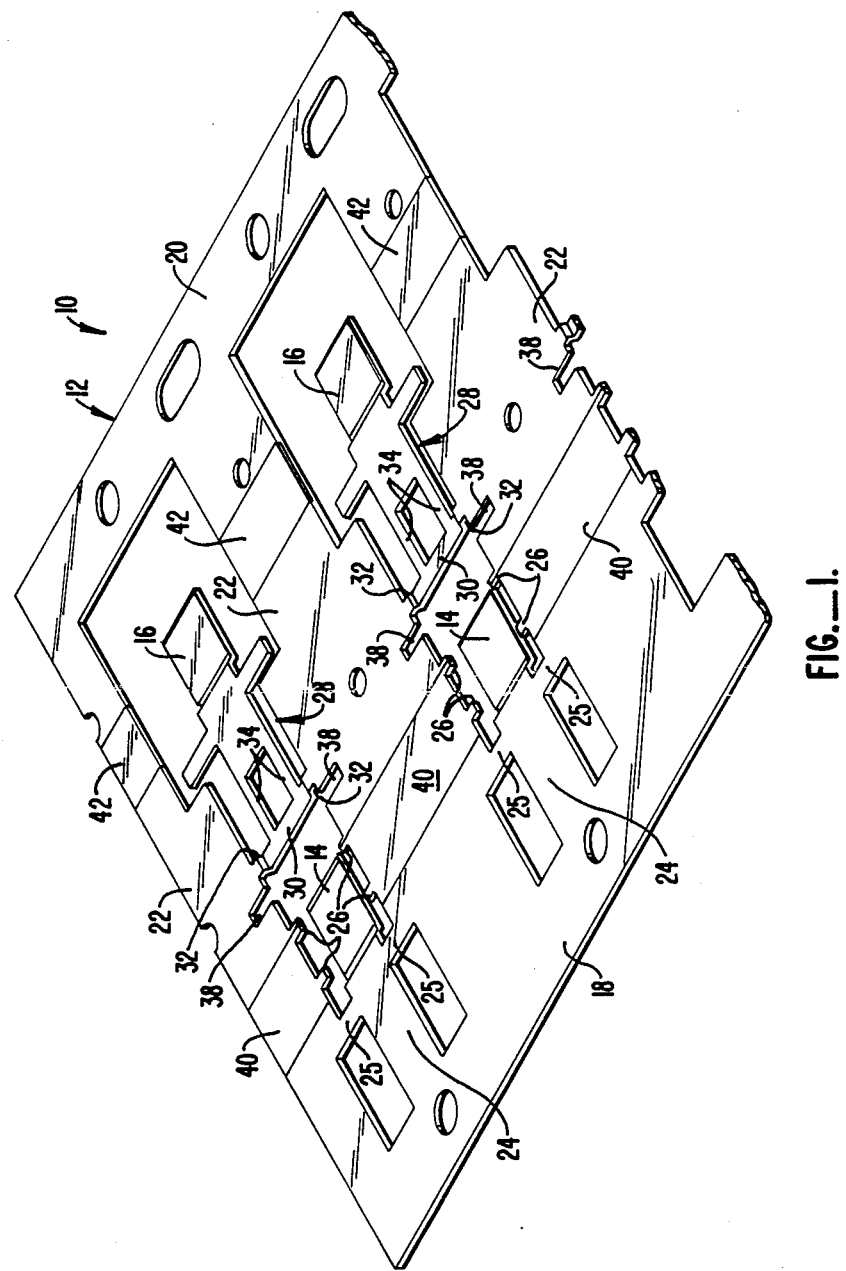
FIG._1.

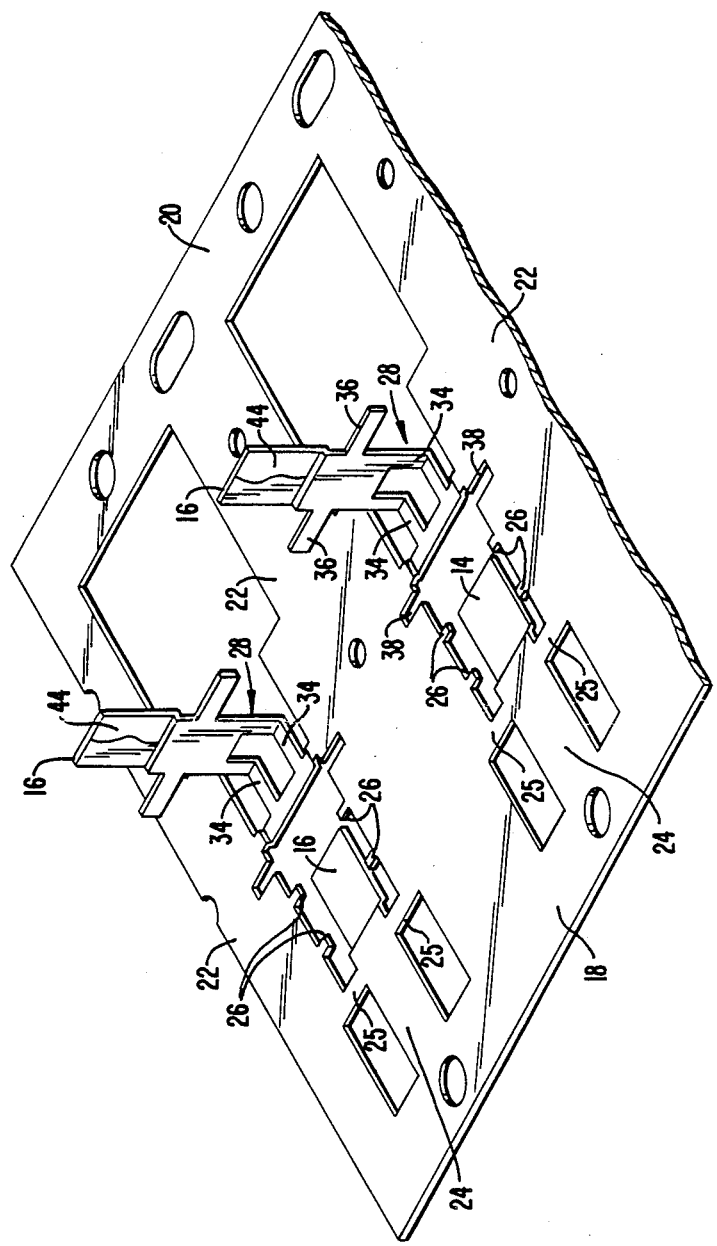
FIG._2.

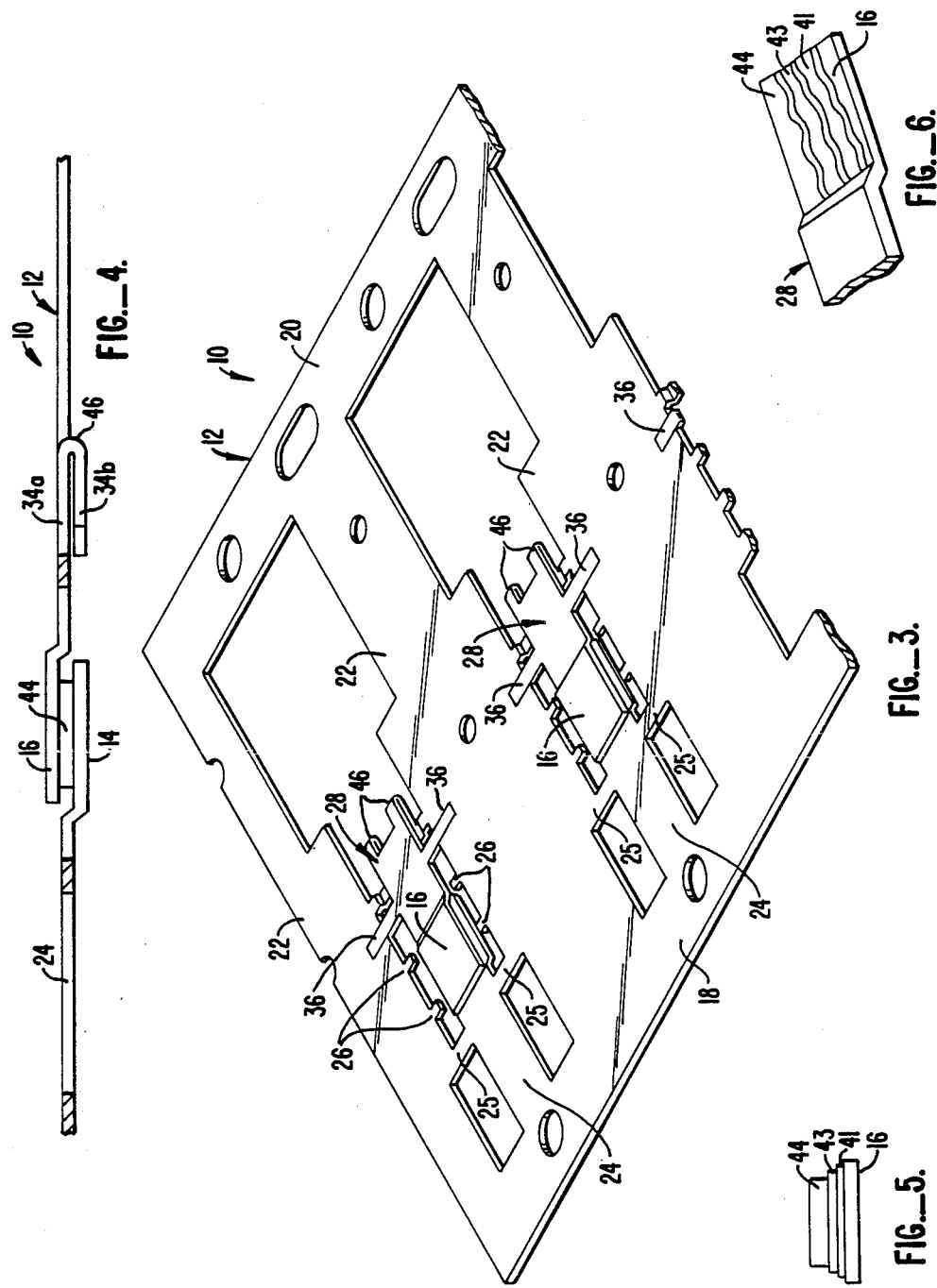

SEMICONDUCTOR LEAD FRAME

This invention relates to improvements in the manufacture of semiconductor components and, more particularly, to an improved lead frame for making a semiconductor diode in volume.

BACKGROUND OF THE INVENTION

The use of lead frames to manufacture a plurality of semiconductor components in volume is well known. Generally, an electronic component made with a semiconductor chip has a plurality of lead wires which are bonded to the chip and to the lead frame in a wire bonding process which is laborious, time consuming and relatively expensive to practice. Thus, it is desirable to continually seek improvements in the attachment and the electrical bonding of semiconductor chips to lead frames during electronic component manufacture.

It is also known in the manufacture of electronic components using semiconductor chips to bend certain parts of a lead frame so that a semiconductor chip or chips can be more effectively coupled to the lead frame in the production of an electronic component. Examples of this technique are disclosed in U.S. Pat. Nos. 4,252,864 and 4,446,375.

U.S. Pat. No. 4,252,864 describes a lead frame which provides a tab configuration which allows certain tabs to be bent in a direction normally of the plane of the lead frame so that a pair of tabs will be in coplanar relationship and a third tab will lie in a plane which is parallel to the plane of the pair of tabs. The chip coupled with the tabs is first soldered to the tabs before the bending of the tabs occurs. Lead wires are used to couple the chip to the lead frame.

U.S. Pat. No. 4,446,375 shows a lead frame used for making optocouplers in which parts of the lead frame are bent at two locations to cause a first tab to overlie a second tab with the tabs being provided with semiconductor chips thereon. Thus, an optocoupler formed from the two chips is defined by the two face-to-face chips.

Other patents pertinent to this art include U.S. Pat. Nos. 3,893,158, 4,160,308 and 4,322,628.

While the foregoing patents disclose lead frames which can simplify to some degree the manufacture of electronic components using semiconductor chips, they are not suitable for the high speed production of electronic diodes made from a chip and requiring only a pair of terminals coupled with the chip. The present invention is directed to satisfying a need for further improvements in lead frames of the type used for the manufacture of electronic components.

SUMMARY OF THE INVENTION

The present invention is directed to an improved lead frame which is simple and rugged in construction, is provided with two sets of pads, each pad of one set being aligned with a respective pad of the other set. One of the pads of each pair is coupled by leg means to the body of the lead frame and the leg means is bendable intermediate its ends to cause the one pad to be shifted from an initial position generally aligned with the other pad of the pair to a final position in overlying spaced relationship to the other pad.

The pads are provided with coatings of a bonding agent, such as solder and a chip can be applied to one of the pads before the bending of the leg means so that the chips will be in position between the pads and ready for bonding to the pads when the lead frame is passed through a heating zone, such as a furnace to melt the bonding agent and cause the bonding of the chip to the adjacent pads. Thus, the present invention provides an improved lead frame for making an electronic diode in which the lead frame requires only minimum bending to position a pair of pads so that a semiconductor chip between the pair of pads can be quickly bonded to the pads in the manufacture of a diode.

The primary object of the present invention is to provide an improved lead frame for making a semiconductor component from a semiconductor chip wherein the lead frame has a plurality of pairs of pads with one pad of each pair being bendable in a single bend to a position overlying the other pad of the pair so that a semiconductor chip between the aligned pads can be bonded thereto quickly and easily to thereby simplify and accelerate the manufacture of a large volume of components.

Other objects of this invention will become apparent as the following specification progresses, reference being had to the accompanying drawings for an illustration of the invention.

IN THE DRAWINGS

FIG. 1 is a fragmentary, perspective view of the lead frame of the present invention, showing first and second sets of pads for mounting semiconductor chips thereon, the pads of the second set being in initial positions relative to respective pads of the first set before the pads of the second set are pivoted into final positions overlying respective pads of the first set;

FIG. 2 is a view similar to FIG. 1 but showing the locations of the pads of the second set in intermediate positions as they are being pivoted from their initial positions shown in FIG. 1 to final positions shown in FIG. 3;

FIG. 3 is a view similar to FIGS. 1 and 2 but showing the pads of the second set in their final positions adjacent to and overlying respective pads of the first set;

FIG. 4 is an enlarged, fragmentary, cross-sectional view of the lead frame, showing a pad of the second set overlying the respective pad of the first set with a semiconductor chip therebetween; and FIGS. 5 and 6 are end and perspective view of one of the pads of the lead frame.

The lead frame of the present invention is broadly denoted by the numeral 10 and includes a lead frame body 12 of one-piece construction and of suitable electrically conductive material. Body 12 is comprised of a first set of aligned, flat pads 14 and a second set of aligned, flat pads 16, pads 14 being near a first side strip 18 of body 12 and pads 16 being near a second side strip 20 of body 12. Side strips 18 and 20 are generally parallel with each other and are integral with a plurality of cross strips 22 which are spaced from each other and are on respective sides of adjacent pairs of pads 14 and 16 as shown in FIG. 1. Thus, each pad 14 is aligned with its respective pad 16 along an imaginary line generally parallel with the adjacent cross strips 22.

Each pad 14 is connected by a connector member 24 to the adjacent side strip 18 and by connector arms 25 to the adjacent cross strips 22. Pad 14 is in a plane slightly offset from and generally parallel with the plane of member 24 as shown in FIG. 4. Each cross strip 22 has a pair of relatively short, spaced, generally parallel tabs 26 which project toward and are spaced from the adjacent side of a respective pad 14. Thus, there are four tabs 26 associated with and adjacent to each pad 14, respectively.

Each pad 16 is coupled by a connecting member 28 to the adjacent cross strips 22 by way of a cross bar 30 coupled by connecting elements 32. Connecting member 28 includes a pair of spaced, parallel legs 34 which are integral with bar 30 and which extend to a pad 16 and are adapted to be bent intermediate their ends through an angle of about 180° or until the legs are doubled upon themselves as shown in FIGS. 2-4 so as to cause the pad 16 to be in overlying spaced relationship to the respective pad 14 as shown in FIGS. 3 and 4. The flat upper surface of connecting member 28, including the upper surfaces of legs 34 as shown in FIG. 1, is in a plane generally coplanar with and spaced below the plane of the upper surface of cross strips 22. In fact, the plane of the upper surface of connecting member 28 as shown in FIG. 1 is generally parallel with the plane of the upper surface of pad 14. This is shown also in FIG. 4.

Each pad 14 is integral with one end of connecting member 28, and the plane of the upper surface of each pad 16, when the latter is in the initial position thereof shown in FIG. 1, is parallel to and below the plane of the upper surface of connecting member 28. This feature can be discerned from FIG. 4 which shows a pad 16 in its final position overlying a respective pad 14.

Connecting member 28 has a pair of aligned side tabs 36 integral therewith which project outwardly from opposite side margins of connecting member 28 at locations spaced from pad 16 as shown in FIG. 1. Tabs 36 are to be removably received within respective slots 38 formed in the adjacent connecting strips 22, the slots 38 being generally parallel with the adjacent bar 30.

Each pair of pads 14 and 16 are provided at their upper surfaces with coatings 39 and 41 of solder. Such solder coatings are applied to the pads before pad 16 is moved from its initial position shown in FIG. 1 to its final position shown in FIG. 3. Such coatings of solder are applied by any suitable means, preferably by a roller which rolls the solder successively over pads 14 and 16. For instance, in applying solder to pads 14 by a rolling technique, areas 40 (FIG. 1) on cross strips 22 are also coated with solder since they are in alignment with pads 14 along a path generally parallel with and adjacent to side strip 18. Similarly, areas 42 (FIG. 1) on cross strips 22 are coated with solder when solder is applied to pads 16 successively by a rolling technique.

In use, assuming that solder has been applied to the upper surfaces of each pair of pads 14 and 16, a layer 43 of rosin (FIG. 5) is first applied to each pad 16. Then a semiconductor chip 44 is placed on the rosin layer and adheres thereto since the rosin acts as an adhesive, at least temporarily, for holding the chip 44 in place on pad 16. This is shown in FIGS. 1, 5 and 6 wherein the pads 44 are mounted on pads 16 by the rosin layer on the pads.

When the semiconductor chips 44 are positioned on respective pads 16, connecting members 28 are subjected to the action of bending dies which cause connecting members 28 to be bent at the midpoints of respective legs 34 as shown in FIG. 2. The semiconductor chips 44, as shown in FIG. 2, remain attached to respective pads 16 by the rosin layers 43 on the pads 16 as legs 34 are bent through an angle of 90°. The bending of legs 34 continues until the two segments 34a and 34b (FIG. 4) of each leg 34 are generally parallel with each other and until the semiconductor chip 44 of each pad 16 is in substantial engagement with the upper, solder-coated surface of the respective pad 14 as shown in FIG. 4. In such a case, legs 34 are bent into two segments cleanly and smoothly so that the bend is substantially C-shaped with a rounded outer face as shown at location 46 (FIG. 4). Moreover, when each pad 16 overlies its corresponding pad 14, the pads are generally parallel with each other and the semiconductor chip 4 therebetween is in contact with the solder coatings 39 and 41 of respective pads.

As pads 16 move into their operative positions shown in FIGS. 3 and 4, tabs 36 move into respective slots 38 as shown in FIG. 3. This feature causes locking of the respective pad 16 in the proper position in overlying relationship to the corresponding pad 14 therebeneath.

With pads 16 overlying respective pads 14 and with semiconductor chips being between respective pads 14 and 16, lead frame 10 is then moved into and through a heating zone, such as into and through a furnace. In such zone, the solder coatings 39 and 41 on the adjacent faces of pads 14 and 16 are heated to bond the opposed faced of the semiconductor chips 44 to the respective pads 14 and 16. Each pair of pads 14 and 16 and the semiconductor chip 44 bonded thereto are then encapsulated in a molded mass or body in a manner which is well known. When the molding step occurs, the four tabs 26 associated with each pair of pads 14 and 16 will act as a holding device for the molded part to be carried through the various stages of trim, forming and testing. Moreover, the tabs 36 associated with each pair of pads 14 and 16 will act as dam bars during the molding operation.

I claim:
1. A lead frame comprising:
a one-piece body having a pair of spaced, generally parallel side strips and a pair of spaced cross strips spanning the distance between and integral with the side strips, said body further including a pair of spaced, aligned pads and means coupling the pads to the body to position the pads between the cross strips, said coupling means including a leg coupled with one of the pads and extending parallel with the cross strip, said leg being bendable intermediate its ends about an axis extending transversely of the longitudinal axis of the leg to cause the leg to be doubled upon itself and to cause said one pad to be moved from an initial position spaced from and generally aligned with the other pad to a final position, in overlying spaced relationship to the other pad, whereby a semiconductor chip between the pads can be bonded to the pads to form therewith an electronic component.

2. A lead frame as set forth in claim 1, wherein the side and cross strips are in a first plane, said other pad and said leg being in a second plane parallel to the first plane.

3. A lead frame as set forth in claim 2, wherein the one pad is in a plane parallel to the first and second planes when said one pad is in its initial position.

4. A lead frame as set forth in claim 1, wherein said coupling means includes a connecting member having a pair of opposed side margins and a pair of tabs integral with and projecting laterally from respective side margins of the connecting member, said cross strips having a pair of slots for receiving the respective tabs when the one pad is moved into said second position, whereby the tabs in the slots will substantially lock the one pad in said final position.

5. A lead frame as set forth in claim 1, wherein each of said pads includes a face provided with a layer of bonding material thereon.

6. A lead frame as set forth in claim 5, wherein said bonding material is solder.

7. A lead frame as set forth in claim 1, wherein said one pad is in the final position thereof, and wherein is included a semiconductor chip between the pads.

8. A lead frame as set forth in claim 7, wherein is included means on the pads for bonding the chip thereto.

9. A lead frame as set forth in claim 8, wherein said bonding means includes a coating of solder on each pad, respectively.

10. A lead frame for use in making a plurality of electronic components comprising:
a one-piece, electrically conductive body having a pair of spaced, generally parallel side strips and a plurality of spaced, generally parallel cross strips spanning the distance between and integral with the side strips, said body further including a pair of spaced pads for each pair of adjacent cross strips, the pads being between respective cross strips and aligned with each other along a line generally parallel with the cross strips, there being means on said body for coupling each pad to respective cross strips, said coupling means including a pair of spaced legs extending longitudinally of the respective cross strips and being bendable intermediate their ends sufficient to cause the legs to be doubled upon themselves, one pad of each pair being coupled to said legs at the outer ends thereof and being movable from an initial position spaced from and generally longitudinally aligned with the other pad of the pair to a final position in overlying, spaced relationship to the respective other pad, whereby a semiconductor chip between the adjacent pads may be bonded thereto to form therewith an electronic component.

* * * * *

UNITED STATES PATENT AND TRADEMARK OFFICE
CERTIFICATE OF CORRECTION

PATENT NO. :   4,809,054

DATED      :   February 28, 1989

INVENTOR(S) :  Charles Duane Patton and Kurt Waldner

It is certified that error appears in the above-identified patent and that said Letters Patent is hereby corrected as shown below:

Change line [76] on the title page to read:

[76]  Inventors:  Charles Duane Patton and Kurt Waldner

Charles Duane Patton
2147 Newhall St., #128
Santa Clara, CA   95051

Item [19] "Waldner" should read --Patton et al--.

Signed and Sealed this

Seventeenth Day of October, 1989

Attest:

DONALD J. QUIGG

Attesting Officer

Commissioner of Patents and Trademarks